United States Patent [19]

Kowalski et al.

[11] 4,079,489
[45] Mar. 21, 1978

[54] PLACEMENT MACHINE

[75] Inventors: John Lawrence Kowalski, Phoenix; Mark Joseph Michaels, Glendale; Edmund Harold Schieve, Phoenix, all of Ariz.

[73] Assignee: Honeywell Information Systems Inc., Phoenix, Ariz.

[21] Appl. No.: 755,524

[22] Filed: Dec. 30, 1976

[51] Int. Cl.² .................. H05K 13/04; H01L 21/72
[52] U.S. Cl. ............................. 29/33 K; 29/566.2; 29/740; 29/743; 29/809
[58] Field of Search .............. 29/33 K, 33 M, 566.2, 29/566.3, 566.1, 703, 740, 743, 809

[56] References Cited
U.S. PATENT DOCUMENTS 3,581,375  6/1971  Rottman .................... 29/740 X
3,657,790  4/1972  Larrison .................... 29/740

Primary Examiner—Z. R. Bilinsky
Attorney, Agent, or Firm—E. W. Hughes; William W. Holloway, Jr.; Ronald T. Reiling

[57] ABSTRACT

A machine for blanking an integrated circuit chip from a segment of a film strip held in a fixture, forming its leads, and placing the chip on a multilayer substrate. The fixtures are stacked in a magazine which is mounted on the machine. A transfer mechanism transfers one fixture at a time from the magazine to a punch press where the IC chip is blanked from its film segment, and its leads are formed. The punch is retracted, and a multilayer substrate, which is mounted on an X-Y table, is positioned by the table under the punch so that the excised chip is directly above a chip pad and the chip leads are above the chip lead pads of a predetermined chip pad. The punch is lowered to position the chip on its chip pad. The substrate is coated with an adhesive flux to retain the chips and their leads in place. The punch is retracted and the X-Y table is moved to clear the punch press. A microcomputer controls the machine.

21 Claims, 11 Drawing Figures

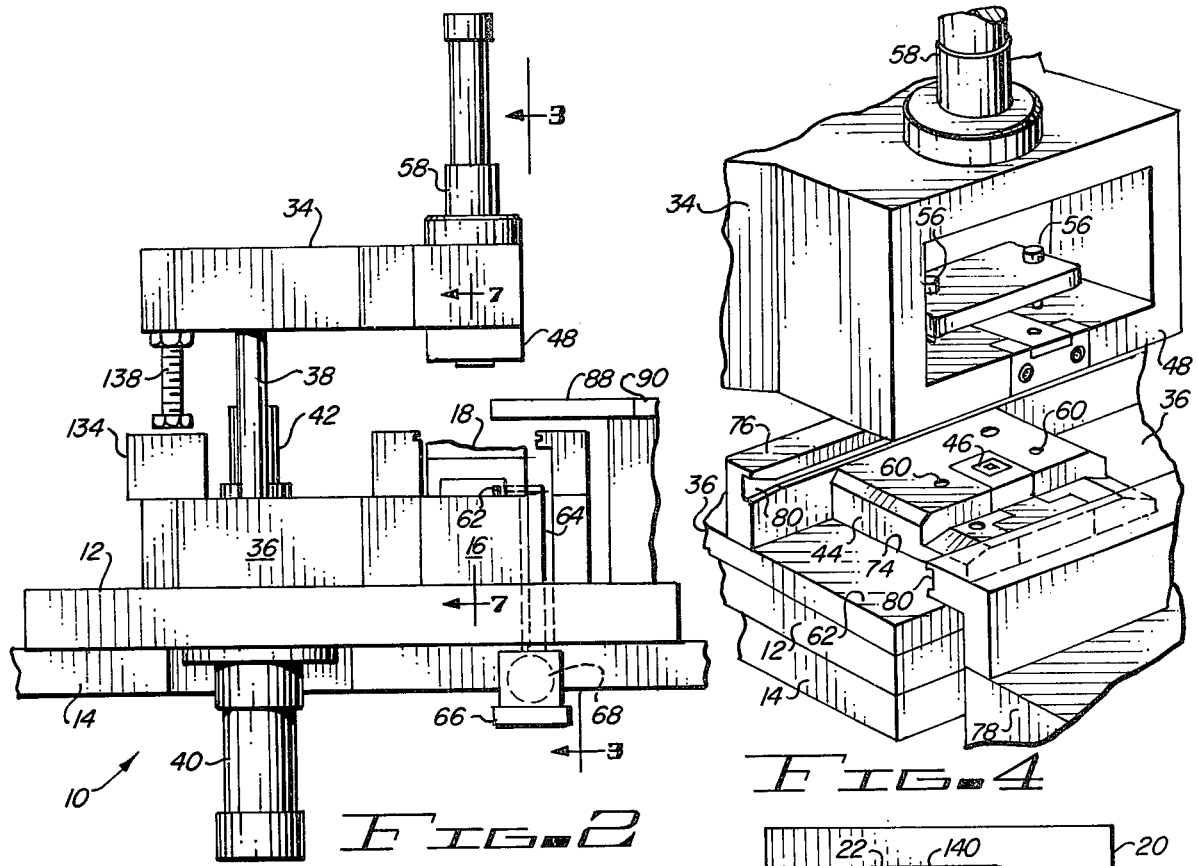
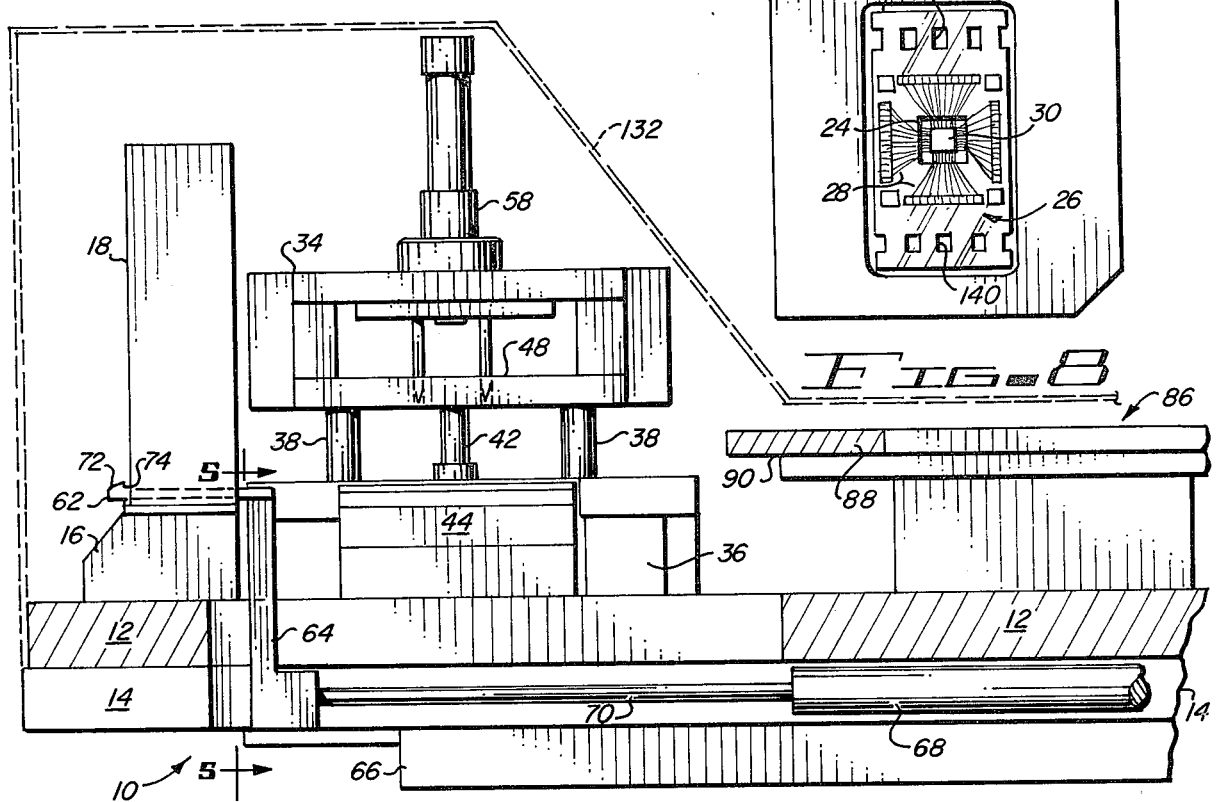

PLACEMENT MACHINE

CROSS REFERENCE TO RELATED APPLICATIONS

The following applications are incorporated by reference into the subject application all of which applications are assigned to the same assignee as the instant invention.

A. "Fixture for an Integrated Circuit Chip" invented by John L. Kowalski, filed Mar. 29, 1976, Ser. No. 671,238 which issued as U.S. Pat. No. 4,007,479 on Feb. 8, 1977.

B. "Magazine for a Plurality of Fixtures Holding Integrated Circuit Chips" invented by K. Boyd Tippetts, filed Aug. 9, 1976, Ser. No. 712,564 which issued as U.S. Pat. No. 4,043,485 on Aug. 23, 1977.

C. "Transfer Mechanism" invented by K. Boyd Tippetts, filed Aug. 9, 1976, Ser. No. 712,565.

D. "Sequencer" invented by John L. Kowalski and K. Boyd Tippetts, filed Aug. 9, 1976, Ser. No. 712,563.

E. "Apparatus for Cutting and Forming Flexible Beam Leads of an Integrated Circuit Chip" invented by Nelson R. Diaz, filed Oct. 18, 1976, Ser. No. 733,557.

BACKGROUND OF THE INVENTION

1. Field of the Invention:

This invention is in the field of machines for performing a series of steps in the process of manufacturing an electronic micropackage. A plurality of integrated circuit (IC) chips are each bonded to a separate flexible lead frame. Each lead frame is in turn secured to a segment of a film strip and each segment is held or mounted in a fixture. Fixtures holding predetermined numbers of predetermined types of IC chips are stacked in a magazine. The machine sequentially feeds a fixture from the magazine to a punch press which blanks the chip and part of its leads from their lead frame, forms the leads and properly places or mounts the chips and its leads on a multilayer substrate of a micropackage. Control of the machine is preferably exercised by a microcomputer.

2. Description of the Prior Art:

The development of integrated circuit (IC) chips, particularly medium and large scale IC chips, has created a need for automating the blanking and forming of the leads of IC chips and the placing of such chips and their leads on chip pads and chip lead pads associated with each chip pad of a multilayer substrate with a sufficient degree of precision so that the chips and their leads can be soldered to their respective pads with a minimum of human intervention. An IC chip and its formed leads, a formed leaded integrated circuit chip, is also referred to as being a "flic", and a chip pad and its associated chip lead pads on which a flic is placed is also referred to as being a "flic" site.

The relevant prior art, as known to applicants, has used two different punch presses, one to blank a chip and a portion of its leads from the balance of their lead frame and another to form the leads, primarily because the leads are made of a very thin ductile metal, copper 0.0014 inches thick, for example. Such thin metal leads have not heretofore lent themselves to being cut and formed in a single operation. Alternatively, the leads are preformed by one punch press and then the chip and its preformed leads are excised from the balance of the lead frame in a second operation. Placing of flics or flic sites of a multilayer substrate has heretofore been done by human operators.

The prior art has not, to applicant's knowledge, developed a machine to place a large number of flics on predetermined flic sites of a multilayer substrate. Because of the small size of a flic and the precision required to properly place a flic on its designated flic site, the human operator must observe the process under a microscope, tedious process. As a result, the time required to mount all the flics on flic sites of a multilayer substrate is substantial. In some cases it takes a skilled operator up to eight hours to properly place 110 flics on the flic sites of a multilayer substrate with the required degree of precision.

SUMMARY OF THE INVENTION

The present invention provides a machine for blanking IC chips and their flexible beam leads from their lead frames, forming the leads and placing the flics on predetermined flic sites. The machine has a base on which is secured a holder. A magazine is removably mounted on the holder. Stacked in the magazine are a predetermined number of fixtures, with each fixture holding a predetermined type of IC chip. To simplify control of the machine, the fixtures can be arranged in a predetermined order. Each chip is bonded to flexible beam leads of a lead frame which lead frame in turn is secured to a segment of a strip of film. Each fixture holds a segment and thus one IC chip and its leads. A punch press and a transfer mechanism are also mounted on the base. The transfer mechanism, when activated, transfers a fixture from the bottom of the stack of fixtures in the magazine to the punch press. The punch press, when the fixture is properly positioned, is activated to blank the IC chip and part of its leads from the lead frame and to form the leads. The punch portion of the press is provided with a vacuum line which enables the punch to lift a chip and its formed leads, a flic. The transfer mechanism then moves the fixture from the punch press to disposal means mounted on the base. A multilayer substrate, which is removably mounted on an extension to a movable plate of a precision X-Y table is caused to move the substrate under the punch with the flic site onto which the flic is to be placed being directly below the flic held by the punch. The punch is lowered into close proximity to the substrate, the flic is released, and the flic then falls onto, or is placed on, the flic site where it is retained by the adhesive qualities of a solder flux with which the surface of the multilayer substrate is coated. The X-Y table is then activated to remove the multilayer substrate from the punch press. The machine is then ready to repeat the cycle. Control of the machine is preferably by a programmed microcomputer.

It is therefore an object of this invention to provide a machine which automates blanking a chip and its leads from their carrier, forming the leads, and precisely placing the chip and its leads on a multilayer substrate.

It is a further object of this invention to provide a machine which significantly reduces the time required to blank an IC chip and its leads from their lead frame, to form the leads, and to place a chip and its leads on a predesignated position on a multilayer substrate.

It is a still further object of this invention to provide a machine for automating the blanking of an IC chip and its leads from their lead frame, forming the leads, and placing the chip at a predetermined location on a multilayer substrate which machine reduces the cost of producing multilayer substrates while increasing the precision with which such multilayer substrates are produced as well as improving the quality and reliability of the end product.

BRIEF DESCRIPTION OF THE DRAWINGS

Other objects, features and advantages of the invention will be readily apparent from the following description of certain preferred embodiments thereof taken in conjunction with the accompanying drawings, although variations and modifications may be affected without departing from the spirit and scope of the novel concepts of the disclosure, and in which:

FIG. 2 is a front elevation of the machine with part of the magazine broken away;

FIG. 3 is a section taken on line 3—3 of FIG. 2;

FIG. 4 is an enlarged fragmentary perspective of the punch press of the machine of our invention;

FIG. 8 is a plan view of a fixture used with the machine of our invention;

DETAILED DESCRIPTION OF THE PREFERRED EMBODIMENT

Figure 1:
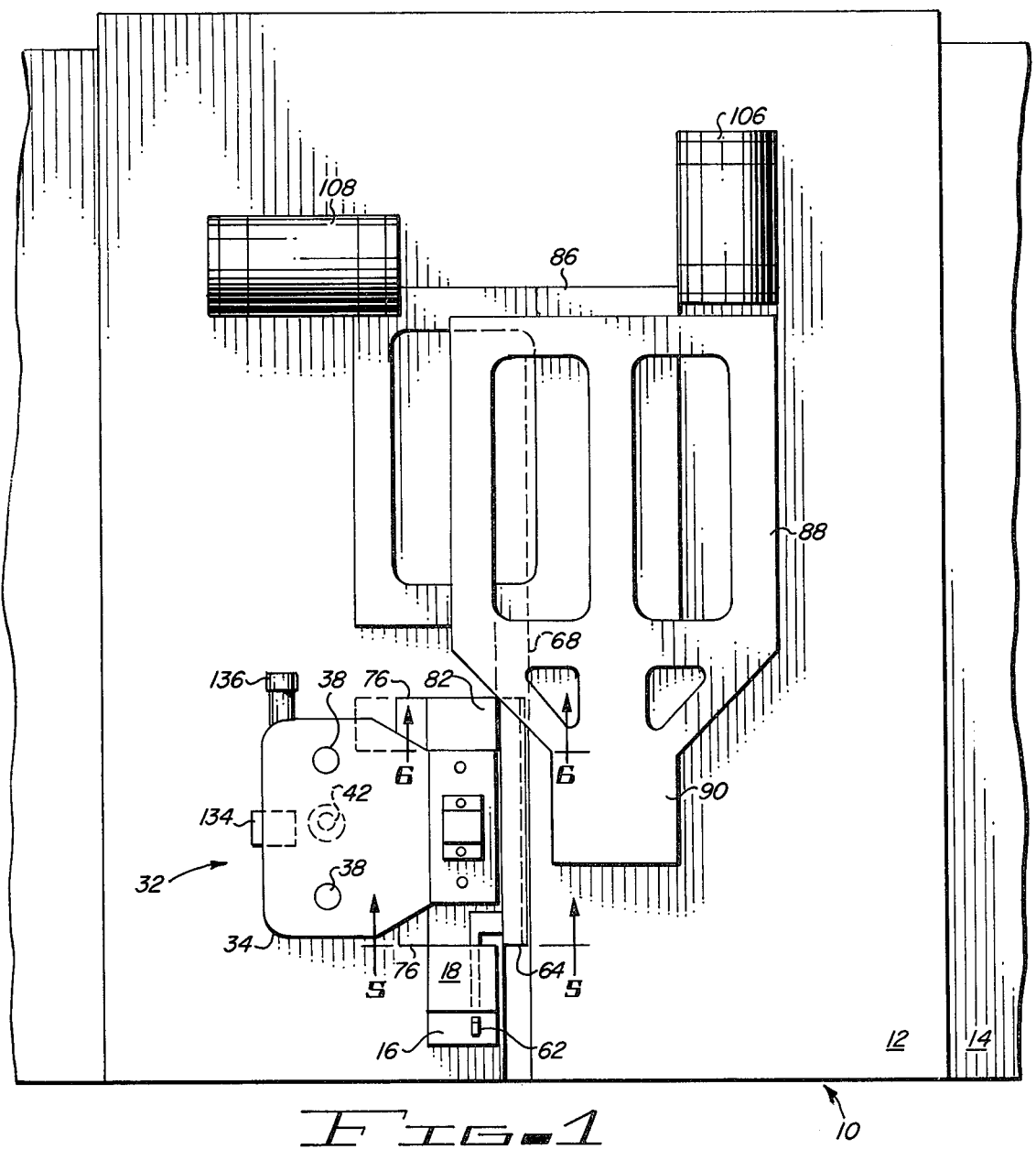
FIG. 1 is a plan view of the machine of our invention.

In FIGS. 1, 2 and 3 machine 10 has a support member or base 12 mounted on a table top 14 so that base 12 is substantially horizontal and at a convenient elevation above a supporting surface, or floor, which is not illustrated. A magazine holder 16 is mounted on base 12 and is adapted to have a magazine 18 removably mounted on it. A magazine holder 16 that can be used in machine 10 is described and illustrated in greater detail in the Application identified in paragraph C of the section of this application entitled "Cross Reference to Related Applications". A magazine 18 that can be used in machine 10 is also described and illustrated in greater detail in the Application identified in paragraph B of the section of this application entitled "Cross Reference to Related Applications".

Stacked vertically within the magazine 18 are a plurality of fixtures 20 one of which is illustrated in FIG. 8. Fixture 20 is adapted to hold a segment of film 22 which has a window 24 formed in it. Bonded to segment 22 is a lead frame 26, preferably made of a thin layer of copper, which has been produced by photoetching process and consists of a plurality of separate conductors, or leads, 28 which are schematically illustrated in FIG. 8. An IC chip 30 has terminals formed on its periphery to which are bonded the inner portions of leads 28. It should be noted that the inner portions of leads 28 extend over window 24 and that chip 30 is located within window 24. When segment 22 is properly positioned in fixture 20, fixture 20 provides access to both sides of the leads 28 and chip 30 which are within window 24. Fixtures 20 and segments 22, which can be used with machine 10, are described and illustrated in the Application identified in paragraph A of the section of this application entitled "Cross Reference to Related Applications".

Figure 7:
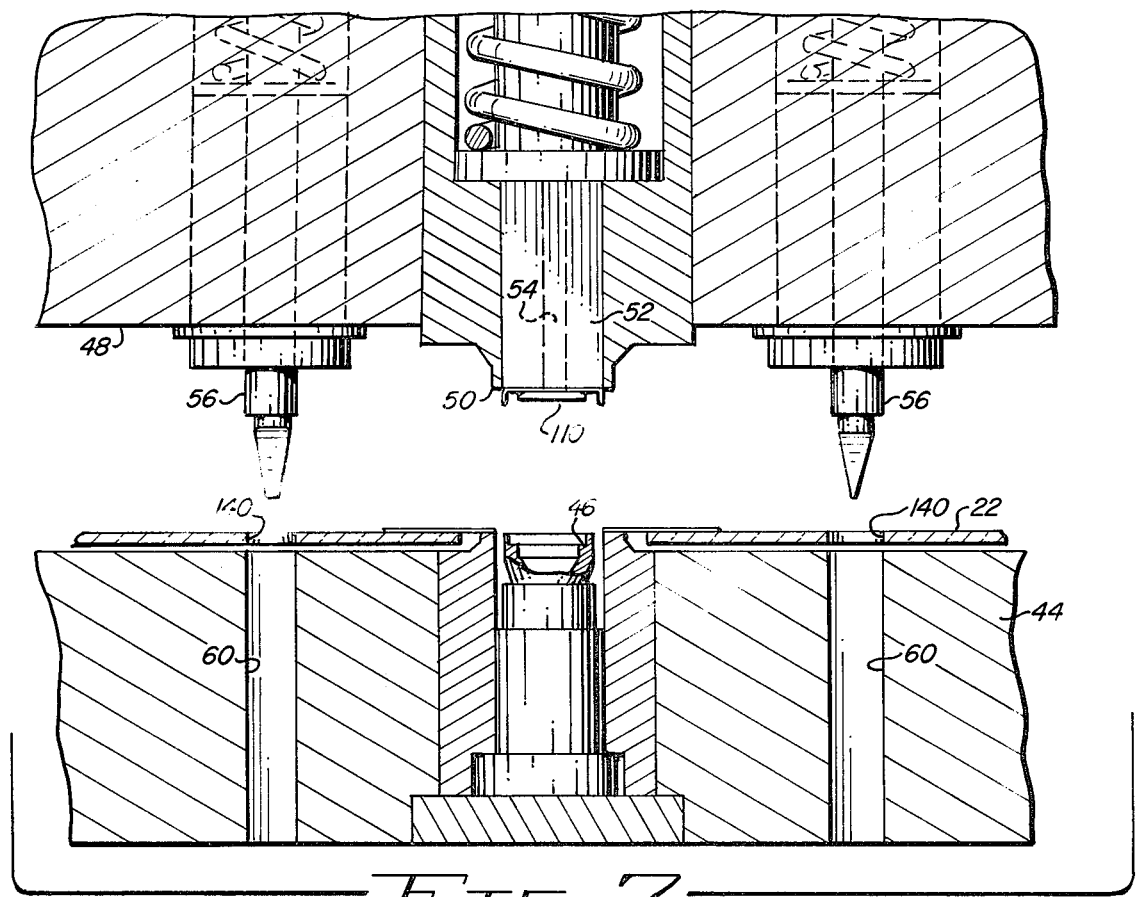
FIG. 7 is an enlarged fragmentary section taken on line 7—7 of FIG. 2.

Punch press 32 has a top plate 34 and a bottom plate 36. Plate 36 is fixedly secured to base 12. Top plate 34 moves reciprocally and linearly with respect to bottom plate 36 and is constrained to do so by a pair of conventional precision sleeves 38. Top plate 34 is moved, or actuated, by a hydraulic cylinder 40 which is mounted on base 12 and whose piston shaft 42 is rigidly secured to top plate 34. Die holder 44 is secured to bottom plate 36 and die 46 is rigidly held to place in die holder 44. Punch holder 48 is secured to top plate 34 in any conventional way and has secured to it a hollow punch 50 which is illustrated in FIG. 7. Movably mounted within punch 50 is a pressure pad 52 which has a bore 54 connected to a conventional source of less than atmospheric pressure, or vacuum, which is not illustrated. Film segment positioning pins 56 are mounted for reciprocal linear motion with respect to punch holder 48. Pins 56 are operatively connected to pneumatic cylinder 58 which is mounted on top plate 34 of punch press 32. Pins 56, when lowered, will project into bores 60 formed in die holder 44 before punch 50 is in blanking relationship with die 46 and when raised do not project below the bottom surface of punch holder 48. Additional details of punch press 32 and its method of operation to blank an IC chip and a portion of the chips lead frame from a segment and to form the leads of the chip are found in the Application identified in paragraph E of the section of this application entitled "Cross Reference to Related Applications".

In order to transfer a fixture 20 from magazine 18 mounted on holder 16, an extractor 62 is mounted on arm 64 which is secured to the movable element of ball slide 66. Ball slide 66 is mounted on the bottom surface of base 12. A two stage pneumatic actuator 68 is also mounted on the bottom surface of base 12 and its cylinder rod 70 is connected to arm 64. Cam surface 72 of extractor 62 permits the extractor 62 to raise a stack of fixtures 20 in magazine 18 as the extractor moves under the magazine away from punch press 32. Actuator 68 pushes the extractor 62 sufficiently beyond the interior of magazine 18 so that one edge of the bottommost fixture 20 in magazine 18 will contact or engage the vertical surface 74 of extractor 62 when it is moved toward punch press 32.

Figure 5:
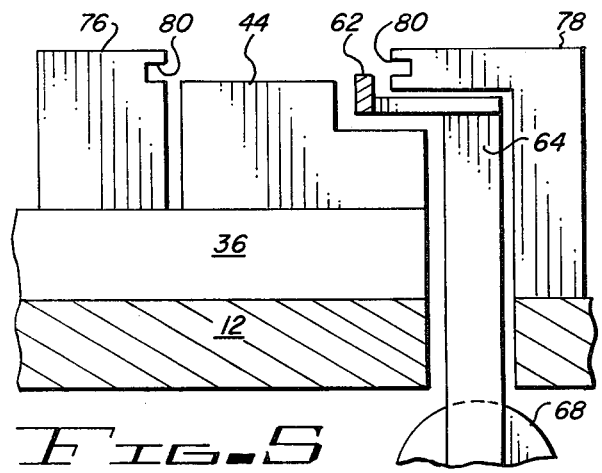
FIG. 5 is an enlarged fragmentary section taken on line 5—5 of FIG. 1.

To properly guide a fixture 20 from magazine 18 to punch press 32, a pair of guides 76, 78 are mounted on either side of die holder 44 with guide 76 mounted on bottom plate 36 of punch press 32 and guide 78 mounted on base 12 as is best seen in FIG. 5. Each guide 76, 78 has a recess 80 along which a fixture 20 slides during the transfer of a fixture from magazine 18 to punch press 32. Guide 78 is undercut to provide clearance for movement of arm 64 of extractor 62 when it moves a fixture 20 from magazine 18 to punch press 32. Similarly, die holder 44 is recessed to provide clearance for extractor 62.

Figure 6:
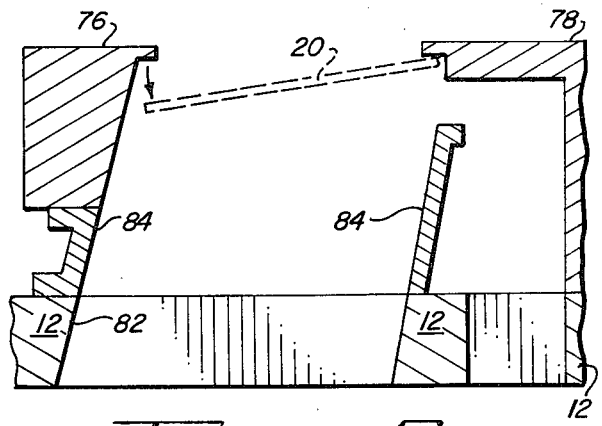
FIG. 6 is an enlarged fragmentary section taken on line 6—6 of FIG. 1.

After punch press 32 has blanked an IC chip 30 and a portion of its lead frame 26 from a segment 22 held in a fixture 20 and the chip 30 with its leads have been lifted upward with punch 50, extractor 62 is caused, by energizing actuator 68, to move fixture 20 between guides 76 and 78 toward disposal opening 82 formed in base 12 through chute 84, which is connected to opening 82. A fixture 20 which falls through opening 82 is collected in a conventional disposal magazine, which is not illustrated, to prevent the accumulation of fixtures from which chips have been removed from interfering in the subsequent operation of machine 10. As can best be seen in FIG. 6, the lower portions of guides 76 and 78 are cut away so that as a fixture 20 is moved over opening 82 by extractor 62, it will fall into the opening 82.

Figure 11:
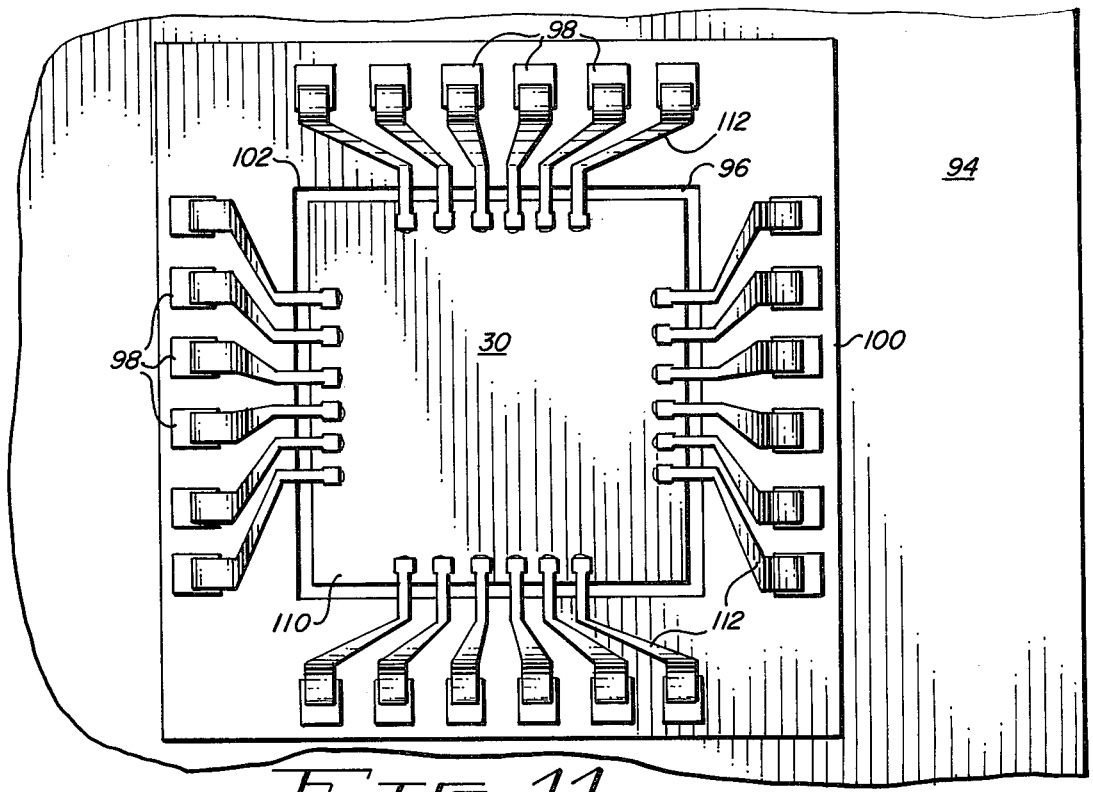
FIG. 11 is a greatly enlarged view of a flic which has been placed on a flic site of a multilayer substrate by the machine of our invention.

A conventional precision X-Y table 86 is mounted on base 12. Movable plate 88 of table 86 is provided with a projection 90 on which is secured a multilayer substrate holder 92 which is adapted to removably hold a multilayer substrate 94. Multilayer substrate 94, in a preferred example, has a ceramic base of aluminum oxide in the form of a square 80 mm by 80 mm. The ceramic base has a number of layers of electrical conductors and insulators formed on it by conventional silk screening processes, up to eight such layers are provided in one embodiment, with a plurality of from fifty to one hundred and ten chip pads 96 formed on the top surface of a substrate 94. As can best be seen in FIG. 11, each chip pad 96 will have associated with it a predetermined number of chip lead pads 98 which also have predetermined locations with respect to chip pad 96 with which they are associated. Reference numeral 100 is used to designate the area of multilayer substrate 94 within which a chip pad 96 and its associated chip lead pads 98, which together form a flic site 102, are located.

Figure 10:
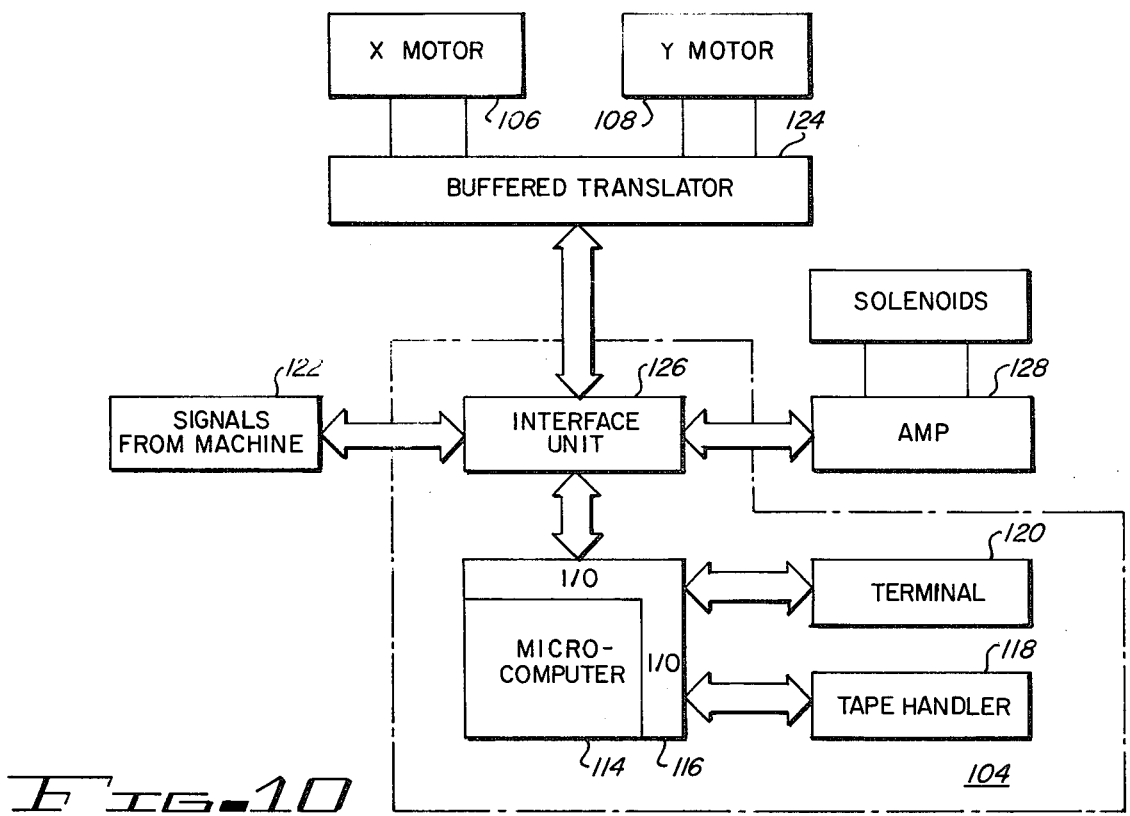
FIG. 10 is a block diagram of the control system of the machine of our invention.
Figure 9:
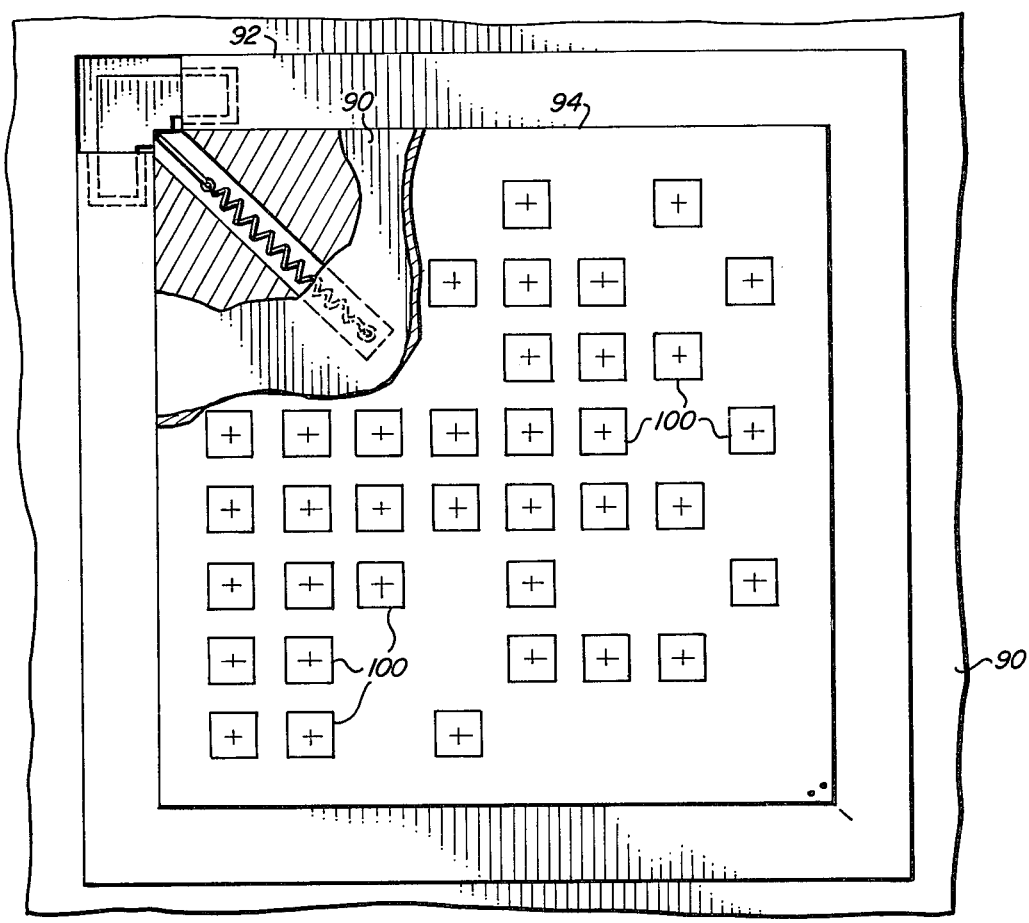
FIG. 9 is a plan view of a multiplier substrate mounted on the machine of our invention, partly broken away to show details of the mounting means.

In FIG. 10, control means 104 provide control signals to drive motors 106, 108 of X-Y table 86 to position plate 88, as well as controlling the energization of the various pneumatic cylinders, and hydraulic cylinders, or actuators, used in the operation of machine 10, for example, to transfer a fixture 20 from magazine 18 to punch press 32, to precisely position a fixture on punch press 32, to cause the punch press to blank an IC chip from its fixture, to remove the flic 110, a chip 30 and its formed leads 112 from the fixture by a vacuum that causes the flic to adhere to punch 50 as it is raised, to dispose of a fixture after its chip has been removed, and the placement of a flic 110 on a designated flic site 102 within a given block 100 of a multilayer substrate 94.

In a preferred embodiment, control means 104 comprises a microcomputer 114 which is provided with an input/output (I/O) subsystem 116 through which digital information is supplied to microcomputer 114 and through which digital information is transmitted from computer 114. Certain information required by computer 114 is supplied by tape handler 118 and the information received is stored in a conventional random access memory subsystem of computer 114. Terminal 120, which includes a display unit, a keyboard, and a printer can be used to supply control information and data to computer 114 and to display for the benefit of the operator, information produced by computer 114 in response to a program or programs stored in the memory subsystem of microcomputer 114. In addition, various signals can be supplied to microcomputer 114 from conventional switches and other types of sensors which are useful in properly controlling machine 10. Such sources are generally designated by block 122.

Conventional stepping motors 106, 108 are driven by a conventional buffering translator 124. Computer 114 will, in one mode of operation, calculate and then produce signals representing the number of pulses that are required to be applied to motors 106, 108 to drive movable plate 88 from a first position having a given set of "X", "Y" coordinates to a second such position having a different set of "X", "Y" coordinates. The signals represent the number of pulses needed to do this; i.e., the change of the X coordinates and the change of the Y coordinates and are applied to interface unit 126. Interface unit 126 produces the desired number of pulses and applies the correct number of pulses representing the changes in the X and Y coordinates serially to buffered translator 124. Buffered translator 124 produces the same number of pulses as are applied to it which pulses are applied by buffered translator 124 to motors 106, 108 by buffered translator 124 at rates that are consistent with the physical characteristics of X-Y table 86 so that movable plate 88 will be precisely positioned in response to the number of pulses supplied to X motor 106 and Y motor 108, respectively.

Signals to control the various actuators of machine 10 are produced by computer 114 and applied to interface unit 126. The necessary control signals are produced and connected to the right electrical conductors by interface unit 126. Some of the control signals are amplified circuits generally indicated by block 128 to produce electrical signals of the proper voltage, current, and period to control solenoids, generally indicated by block 130 which control pneumatic and hydraulic valves, in the preferred embodiment, which valves control the energization of the various actuators used in machine 10.

A cover, or guard, 132 shown in phantom lines in FIG. 3, is made of thin sheet of clear plastic material and is secured to base 12 to prevent an operator from being injured during operation of machine 10, primarily by a limb of the operator coming in contact with movable elements of machine 10. A conventional door, which is not illustrated, is provided with suitable switches to detect if the door is closed or open. The door permits the operator of machine 10 to place a magazine 18 in which are stacked a plurality of fixtures 20 on holder 16, to remove the magazine when the fixtures have been unloaded from the magazine, as well as to place a substrate 94 on plate 88 and to remove it after all the flics 110 have been placed on substrate 94 by machine 10. The cover 132 can be easily removed to provide access to all components of the machine 10 above table 14 for routine service and repair.

In the preferred embodiment, each of the stepping motors 106, 108 makes one revolution for each 200 pulses applied to each of them from buffered translator 124. Since movable plate 88 can move a maximum of 6 inches in either the X or Y direction starting from the origin, 0,0, and plate 88 moves 0.001 inches per pulse, the maximum number of pulses to be applied to motors 106, 108 is six thousand. The degree of repeatability with which plate 88 can be positioned is ± 0.0003 inches.

In operation an operator will type in at terminal 120 the identification of, or model number of, a multilayer substrate 94 that is to have chips mounted on its chip pads, or flics placed on flic sites of the substrate. Microcomputer 114 will then search the tape mounted on tape handler 118 to find the file having as its file number, the model number of the substrate. The computer will cause tape handler 118 to read that file and stores the file in its random access memory subsystem. Essentially, the file will contain the X-Y coordinates of the centers of each of the flic sites 102 for that model number or type of substrate. The operator will then place the substrate having the given model number on substrate holder 92 of movable plate 88 making certain that the substrate is properly oriented on holder 92. Appropriate indicia to assist the operator in doing so are provided on the holder 92 and on the substrate 94. To facilitate loading of a substrate 94 on holder 92, computer 114 is programmed to cause plate 88 to be moved toward a substrate loading position, which in a preferred embodiment is at the front of machine 10 at a position that is at the far right, as observed by the operator standing in front of machine 10, of the X-Y table's field of motion so that the substrate holder 92 is as close to the operator as possible. This position is designated as the origin of the X-Y coordinate system of X-Y table 86 and is the point from which all measurements of the movement of the X-Y table 86 are made. When X-Y table 86 is in its 0,0 position, X-Y table 86 will send a signal to computer 114 to that effect. Prior to a substrate 94 being loaded, or placed in holder 92, its upper surface and particularly its chip pads 96 and chip lead pads 98 are coated with a thin layer of water white flux which is sufficiently adhesive to retain the flics 110 on their flic sites 102. A substrate 94 is then positioned on holder 92. The operator then loads a magazine 18 onto magazine holder 16. Magazine 18 will have stacked in it in a predetermined order a predetermined number of predetermined types of chips with each chip being held by a fixture 20. Magazine 18 can be machine loaded by a sequencer such as is described in paragraph D of the section of this application entitled "Cross Reference to Related Applications".

It should be noted that in the preferred embodiment the order in which the locations of the centers of the chip pads or flic sites are loaded into the memory subsystem of microcomputer 108 corresponds to the order in which chips are stacked in the magazine 18. The operator closes the door of protective cover 132. Computer 114 will then calculate the amount of changes in the X and Y coordinates that the X-Y table must be driven to move plate 88 so as not to interfere with the operation of punch press 32 and will supply the necessary data to interface unit 126, which produces the number of pulses needed to drive motors 106, 108 to do so, assuming the door of protective cover, 132 is closed, that a substrate 94 has been mounted on substrate holder 92 and a magazine 18 has been placed in the magazine holder 16. The various switches or sensors that sense these conditions are conventional and therefore are not illustrated. The signals conveying this information are transmitted to processor 114 from block 122 through interface unit 126. In addition, computer 114 is provided with signals representing the status of punch press 32, i.e., is the punch in its up position with positioning pins 56 retracted, is stop block 134, which is moved by pneumatic cylinder 136, positioned so that stop block 134 will not contact the adjustable stop bolt 138 which is adjustably secured to top plate 34 of punch press 32 and the location of extractor 62. If all of the appropriate signals have the correct values, computer 114 will cause interface unit 126 to energize the solenoid that supplies compressed air to actuator 68 to drive extractor 62 to the position in which it is under the magazine 18 as illustrated in FIG. 3. As the extractor 62 moves under magazine 18 the bottommost fixture 200 in magazine 20 rides up over cam surface 72 and as the cam surface 72 passes beyond the interior of magazine 18, its first position, the bottommost fixture 20 will fall to the bottom of magazine 18. Computer 114 then produces signals that cause actuator 68 to move from its first position to a second position in which a fixture is located in punch press 32. The bottommost fixture 20 as it is being moved from magazine 18 will have one of its sides engaged by vertical surface 74 of extractor 62 and will slide along the recesses 80 in guides 76, 78. Actuator 68 stops when fixture 20 is approximately over die 46 of punch press 32 with the reference or datum sprocket holes 140 of segment 22 substantially above the segment positioning bores 60 in die holder 44. When the extractor 62 has properly positioned a segment 20 with respect to the die holder 44, the punch press 32 is then actuated by control signals from computer 114. First segment positioning pins 56 are lowered by the actuation or energization of pneumatic cylinder 58 to precisely position segment 22 with respect to the die 46. Control signals cause cylinder 40 to be energized to drive top plate 34 toward bottom plate 36 to blank out chip 30 and a portion of its leads 28 from segment 22 which is held in fixture 20. At the completion of the down stroke cylinder 40 is then energized in response to signals from computer 114 to move top plate 34 upwards and simultaneously a vacuum is applied to bore 54 of pressure pad 52 to lift chip 30 and its formed leads from die 46 and to retain it.

Extractor 62 is then actuated to move fixture 20 from which chip 30 has just been removed to the disposal position where it falls through opening 82 in the base 12. With plate 34 in its up position, stop block 134 is moved so that it could engage stop bolt 138 and simultaneously pins 56 are retracted. Computer 114 will have, in the meantime, calculated the changes in the X and Y ccordinates of plate 88 necessary to place the center of a flic site 102 of the flic 110 held by punch 50 directly under the center of punch 50. Top plate 34 is then lowered by actuation of the cylinder 40 until the stop bolt 138 contacts stop block 134 which places flic 110 a very short distance above the flic site 102 of substrate 94 on which it is to be placed. The vacuum line to bore 54 in pressure pad 52 of punch 50 is then cut off and bore 54 is connected to ambient air pressure so that the flic 110 will drop the very short distance from the punch 50 to flic site 102 of the substrate where it is retained by the adhesive characteristics of the flux with which the substrate has been coated.

Computer 114 will then cause the movable plate 88 to move plate 88 and substrate 94 away from punch press 32 to clear punch press 32 and return extractor 62 to a position in which it projects under the then bottommost fixture 20 in magazine 18. The cycle of operation of machine 10 as set forth above is repeated until all of the fixtures 20 have been removed from a magazine 18 on holder 16 and all the chips 30 and their leads have been formed into flics 110 and the flics 110 placed on predetermined flic sites 102 of substrate 94. When the last flic 110 has been placed on its flic site 102, computer 114 will then cause X-Y table 86 to position the extension 90 of movable plate 88 at its 0,0 position. The operator can then remove the empty magazine 18 and multilayer substrate 94.

In a preferred embodiment, the X-Y table is a model 6136F manufactured by the Summit Engineering Corporation of Boseman, Montana, the microprocessor is an Intel model 8080A, the tape handler is a Cipher Model C-200, the keyboard is a Microswitch model 53SW1-2 and the buffered translator is a model 8083A which is manufactured by the Summit Egnineering Corporation of Boseman, Montana.

Machine 10 is provided with a conventional photocell which is not illustrated that senses when a fixture 20 is being transferred from magazine 18 to punch press 32. If a chip of a type that is to be placed on a substrate 94 at a given location is not available for any reason, and if it is still desired to place such chips as are available on substrate 94, then a special fixture 20 can be substituted, which special fixture will, when scanned by the photocell, produce a distinct signal indicating that the fixture does not hold a chip. This signal causes computer 114 to cause actuator 68 to move the special fixture to the disposal means without stopping at punch 32. Punch 32 will not be actuated and X-Y table 86 will not be moved under punch 50. Computer 114 then moves to the next cycle.

Because all chips are not necessarily of a size that can be blanked by a punch press of one size, machine 10 can be modified to have more than one punch press. If that is the case, the information read into the computer with the locations of the centers of the die pads will also identify which punch press will be used, the computer 114 will provide signals to cause the transfer mechanism to deliver a fixture 20 to the proper punch press and to provide signals to control the operation of the punch press to which the fixture is transferred, as well as the correct number of pulses to be applied to X motor 106 and Y motor 108 to properly place a flic 110 on its designated flic site 102.

In the preferred embodiment it is necessary to have the fixtures 20 stacked in magazine 18 in a predetermined order. It is within the scope of this invention that the type of chip held by each fixture be encoded in a machine readable indicia either on each fixture on the segment to which each chip is secured. A conventional reader would scan each fixture or segment as it is extracted from its magazine. Computer 114 would be programmed to accept this information and to determine the location of a flic site 102 on substrate 94 mounted on X-Y table 86 on which that flic 110 can be placed and to cause that flic to be placed on it. With such modifications it would not be necessary that the fixtures 20 be arranged or stacked in magazine 18 in a predetermined order.

While the preferred embodiment uses a microcomputer to produce the control signals because of the flexibility, speed and reliability that is associated with digital computer control, obviously other sources of control signals can be used. For instance, control signals could be supplied by a tape reader with the positions or stations of the machine, the number of fixtures to be transferred, and the locations of the die pads being specified on a paper tape, magnetic tape, or on a magnetic disk for each of the different types of micropackages to be built. Similarly, control signals could be applied directly from a conventional keyboard by an operator.

It should be evident from the foregoing that various modifications can be made to the described embodiments without departing from the scope of the present invention.

We claim as our invention:

1. A machine comprising:
   a base;
   a holder for removably mounting a magazine mounted on said base;
   a magazine mounted on said holder;
   a plurality of segments of a film strip, each segment having a flexible beam lead frame mounted on the segment and an IC chip bonded to inner portions of the leads of each lead frame;
   a plurality of fixtures, each fixture holding one of said segments, a predetermined number of said fixures being stacked in said magazine;
   a punch press for blanking an IC chip and its leads from a segment, for forming the leads, said chip and its formed leads constituting a flic, for removing the flic from its segment and for holding the flic, said punch press being mounted on the base;
   means for disposing of a fixture,
   transfer means mounted on the base for transferring a fixture from a magazine mounted on said holder to the punch press and for transferring a fixture from the punch press to said means for disposing of a fixture;
   positioning means mounted on said base;
   means for removably mounting a multilayer substrate on said positioning means;
   a substrate having a plurality of flic sites, the locations of said flic sites on said substrate being predetermined; said substrate being positioned on said positioning means;
   control means for causing the transfer mechanism to transfer a fixture from the magazine to the punch press; for causing the punch press to blank a chip and its leads from their segment, to form the leads, to remove the flic from its segment and fixture and to retain the flic; for causing the transfer mechanism to move the fixture from the punch press to the means for disposing of a fixture to dispose of the fixture, for causing the positioning means to place the substrate with respect to the punch press so that the flic from the disposed fixture retained by the punch press is directly above a predetermined flic site on the substrate; for causing the punch press to place the flic substantially on its predetermined flic site; and for causing the positioning means to move the substrate away from the punch press to clear the punch press for the next blanking and forming operation.

2. The machine of claim 1 in which the control means include a digital computer.

3. The machine of claim 2 in which the positioning means is an X-Y table.

4. A machine comprising;
   a base,
   a holder for removably mounting a magazine;
   a magazine mounted on said holder;
   a plurality of segments of film strip, each segment having a flexible beam lead frame mounted on the segment and an integrated circuit chip of a given type bonded to inner portions of the leads of the lead frame;
   a plurality of fixtures, each fixture holding one of said segments, said fixtures holding predetermined numbers of predetermined types of chips and being stacked in said magazine;
   a punch press for blanking an IC chip and its leads from a segment held by a fixture, for forming the leads of the chip, for removing the chip and its formed leads from their segment by lifting the chip clear of its fixture, and for holding said chip, said punch press being mounted on the base;
   means for disposing of a fixture,
   a transfer mechanism mounted on the base for transferring a fixture from the magazine to the punch press and for moving said fixture from said punch press to said means for disposing of a fixture;
   an X-Y table having a movable plate mounted on said base;

mounting means formed on the movable plate of the X-Y table for removably mounting a multilayer substrate;

a multilayer substrate having a plurality of chip pads, each chip pad having a plurality of chip lead pads associated therewith, the locations of said pads on the substrate being predetermined, said substrate being positioned on said mounting means; transfer a fixture from the magazine to the punch press; for causing the punch press to remove a chip and its leads from their segment, to form the leads, to remove the chip and its formed leads from its segment and fixture, to lift the chip clear of the fixture, and to retain the chip; for causing the transfer mechanism to move the fixture to the means for disposing of a fixture to dispose of the fixture; for causing the X-Y table to place its movable plate with respect to the punch press so that a chip and its leads blanked from the disposed of fixture and held by the punch press is directly above a predetermined chip pad and its associated chip lead pads on the substrate, for causing the punch press to place the chip substantially on its chip pad with said chips leads substantially on their respective chip lead pads, and to release the chip; and for causing the positioning means to move the movable plate to clear the punch press.

5. The machine of claim 4 in which the control means include a digital computer.

6. The machine of claim 5 in which the fixtures are stacked in the magazine in a predetermined order.

7. The machine of claim 6 in which the punch press have a movable punch and a fixed die, and the chip after it is blanked from its fixture and its leads are formed is lifted by the punch and is retained by retaining means formed in the punch.

8. The machine of claim 7 in which the retaining means formed in the punch is a central bore in the punch which is connected to a source of less than atmospheric pressure.

9. The machine of claim 8 in which the movable plate of the X-Y table has a projection on which is formed the mounting means for a multilayer substrate.

10. The machine of claim 9 in which the punch press is provided with means for precisely positioning a chip mounted in a fixture with respect to the die prior to the chip and its leads being blanked from their fixtures.

11. A machine comprising:
a base;
a holder for removably mounting a magazine, said holder being mounted on said base;
a magazine, said magazine being mounted on said holder;
a plurality of segments of a film strip, each segment having a flexible beam lead frame mounted on it and having an IC chip bonded to inner portions of the leads of the lead frame;
a plurality of fixtures, each fixture holding one of said segments, said fixtures being stacked in said magazine;
first means for blanking an IC chip and a portion of the chips thin flexible ductile leads from a segment of film, for forming the portions of the leads still attached to the chip, and for separating said chip from its fixture and holding said chip, said means for blanking and forming being mounted on the base;

means mounted on said base for disposing of fixtures after its IC chip has been removed;
a transfer mechanism mounted on the base for transferring a fixture from the magazine to the first means, and for transferring the fixture from the first means to the means for disposing of the fixture;
positioning means mounted on said base having an initial position in which the positioning means is clear of said first means;
means for removably mounting a multilayer substrate on said positioning means;
a multilayer substrate, said substrate having a plurality of chip pads, each chip pad having a plurality of chip lead pads associated therewith, the locations of said chip pads on said substrate being at predetermined locations and the location of the chip lead pads with respect to their associated chip lead pads being predetermined, said substrate being positioned on said positioning means; and
control means for causing;
the transfer mechanism to transfer a fixture from the magazine to the first means;
for causing the first means to blank a chip and its leads from the segment mounted in the fixture, for forming the leads of the chip, for causing the first means to lift said chip and its formed leads away from the fixture and to hold said chip;
for causing the transfer mechanism to move said fixture to the means for disposing fixtures to cause the fixture to be disposed;
for causing the positioning means to move from its first position to a second position so that the substrate in which the chip and its leads held by the first means are directly above a predetermined chip pad and the chip pad's associated chip lead pads;
for causing the first means to release said chip, whereby the chip is placed on said predetermined chip pad and each of the leads of the chip is placed on a predetermined chip lead pad associated with said predetermined chip pad; and
for causing said positioning means to move to a position in which it is clear of said first means.

12. The machine of claim 11 in which the control means include a digital computer.

13. The machine of claim 12 in which the fixtures hold predetermined number of predetermined types of IC chips and said fixtures are stacked in a predetermined order.

14. The machine of claim 13 in which the first means is a punch press.

15. The machine of claim 14 in which the positioning means is an X-Y table.

16. The machine of claim 15 in which the digital computer is provided with the location of the chip pads onto which chips are to be placed in a predetermined order corresponding to the order in which the fixtures holding predetermined types of chips are stacked in the magazine.

17. A machine comprising:
a base;
a holder mounted on said base for removably mounting a magazine,
a magazine, said magazine being mounted on said holder;
a plurality of segments of a film strip, each segment having a flexible beam lead frame made of a ductile metal mounted on the segment and an IC chip of a given type being bonded to inner portions of the leads of the lead frame;

a plurality of fixtures, each fixture holding one of said segments, predetermined numbers of said fixtures holding predetermined types of IC chips, said fixtues being stacked in said magazine;

a punch press for blanking an IC chip and a portion of the chips thin flexible ductile leads from a segment of film, for forming the portion of the leads still attached to the chip, for lifting the chip above its fixture, said punch press having means for temporarily holding a chip, said punch press being mounted on the base;

means mounted on said base for disposing of fixtures, transfer mechanism mounted on the base for transferring a fixture from the magazine to the punch press and for transferring a fixture from the punch press to the means for disposing of a fixture;

an X-Y table having a movable plate mounted on said base;

means for removably mounting a multilayer substrate on the movable plate, a multilayer substrate, said substrate having a plurality of chip pads, each chip pad having a plurality of chip lead pads associated therewith, the locations of said chip pads on said substrate being at predetermined locations and the location of the chip lead pads with respect to their associated chip pads being predetermined, said substrate being positioned on said positioning means;

control means;

for causing the transfer mechanism to transfer a fixture from the magazine to the punch press;

for causing the punch press to blank a chip and its leads fom their segment, for forming the leads of the chip, for causing the punch press to lift said chip and its formed leads away from the fixture and to hold said chip;

for causing the transfer mechanism to move said fixture to the means for disposing fixtures to dispose of the fixture;

for causing the X-Y table to move its movable plate so that a predetermined chip pad and the chip lead pads associated with said chip pad are under the chip and its leads held by the punch press;

for causing the punch press to release the chip, whereby the chip is placed on said predetermined chip pad and each of the leads of the chip is placed on predetermined chip lead pads associated with the chip pad; and for causing the X-Y table to move its movable plate clear of the punch press.

18. The machine of claim 17 in which the control means include a digital computer.

19. The machine of claim 18 in which the fixtures are stacked in the magazine in a predetermined order.

20. The machine of claim 19 in which the punch press is provided with means to position accurately the IC chip in the punch press prior to said chip being blanked therefrom.

21. The machine of claim 19 in which the digital computer is provided with the locations of the centers of the chip pads onto which each chip is to be placed in a predetermined order which is the same order that the fixtures are stacked in the magazine.

* * * * *